US009346667B2

(12) United States Patent
Ghahremani et al.

(10) Patent No.: US 9,346,667 B2
(45) Date of Patent: May 24, 2016

(54) LEAD FRAME BASED MEMS SENSOR STRUCTURE

(71) Applicant: Infineon Technologies AG, Neubiberg (DE)

(72) Inventors: Cyrus Ghahremani, Regensburg (DE); Horst Theuss, Wenzenbach (DE); Stefan Uwe Schindler, Reichenbach (DE); Dominik Kohl, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 60 days.

(21) Appl. No.: 14/287,230

(22) Filed: May 27, 2014

(65) Prior Publication Data

US 2015/0344294 A1  Dec. 3, 2015

(51) Int. Cl.
*G01L 9/00* (2006.01)
*H01L 21/00* (2006.01)
*B81B 7/00* (2006.01)

(52) U.S. Cl.
CPC ......... *B81B 7/007* (2013.01); *B81B 2201/0257* (2013.01); *H01L 2224/05554* (2013.01); *H01L 2224/48091* (2013.01); *H01L 2224/48137* (2013.01); *H01L 2224/48257* (2013.01); *H01L 2224/49109* (2013.01); *H01L 2224/73265* (2013.01); *H01L 2924/181* (2013.01)

(58) Field of Classification Search
CPC .................. G01L 9/0042; B81B 7/007; H01L 2924/1461; H01L 41/0926; H01L 41/0973
USPC .................. 257/254, 415–419, 669, E29.324; 438/50–53, 123
See application file for complete search history.

(56) References Cited

U.S. PATENT DOCUMENTS

| 7,327,004 | B2* | 2/2008 | Hattori | G01C 19/5719 257/415 |
| 8,602,999 | B2* | 12/2013 | Young | A61B 5/0215 600/486 |
| 2014/0011313 | A1 | 1/2014 | Huckabee et al. | |
| 2015/0146894 | A1* | 5/2015 | Ng | B81C 1/0023 381/175 |

* cited by examiner

Primary Examiner — Calvin Lee

(57) ABSTRACT

A sensor structure is disclosed. The sensor structure may include a lead frame for supporting a MEMS sensor, a recess in a surface of the lead frame, and a MEMS sensor coupled to the surface of the lead frame and arranged over the recess to form a chamber. Alternatively, the lead frame may have a perforation formed through it and the MEMS sensor may be coupled to the surface of the lead frame and arranged over an opening of the perforation.

21 Claims, 10 Drawing Sheets

US 9,346,667 B2

LEAD FRAME BASED MEMS SENSOR STRUCTURE

TECHNICAL FIELD

Various embodiments relate generally to a lead frame based sensor structure which may include a diaphragm element.

BACKGROUND

Many conventional transducers convert a diaphragm deflection into a voltage proportional to the size of the diaphragm deflection. Often, the sensitivity of these transduction systems is limited by the level of signal interference in the form of electrical noise from various sources. In a conventional condenser microphone, for example, a few sources of signal interference may include one or more of the following: the size of the sound inlet opening in the microphone housing; the air flow through the capacitor gap; the impedance of the converter circuit system; and the size of the microphone back volume.

SUMMARY

In various embodiments, a micro-electro-mechanical system (MEMS) sensor structure is disclosed. The MEMS sensor structure may include a lead frame for supporting a MEMS sensor; a recess in a surface of the lead frame; and a MEMS sensor coupled to the surface of the lead frame and arranged over the recess to form a chamber. According to various embodiments, the MEMS sensor structure may be configured to convert an incident sound wave into an electrical signal.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosure. In the following description, various embodiments of the disclosure are described with reference to the following drawings, in which.

DESCRIPTION

The following detailed description refers to the accompanying drawings that show, by way of illustration, specific details and embodiments in which the disclosure may be practiced.

The word "exemplary" is used herein to mean "serving as an example, instance, or illustration." Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

In various embodiments, a diaphragm may include a plate or a membrane. A plate may be understood as being a diaphragm under pressure. A membrane may be understood as a diaphragm under tension. Although various embodiments will be described in more detail below with reference to a membrane, they may be alternatively provided with a plate, or in general with a diaphragm.

Figure 1:
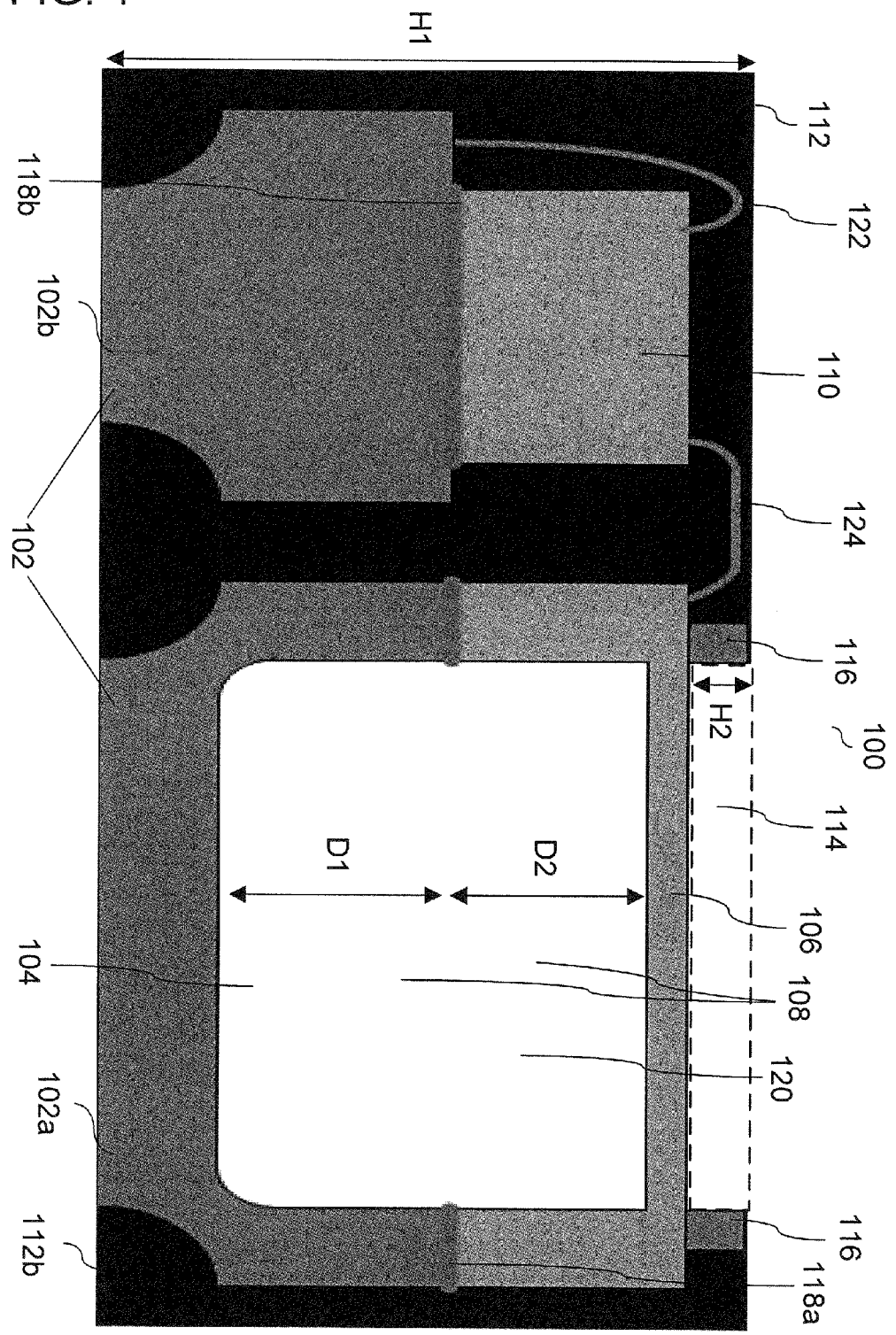
FIG. 1 depicts a cross-sectional representation of a lead frame based transducer structure in accordance with various embodiments.

According to various embodiments, as illustrated in FIG. 1, a MEMS sensor structure 100 is disclosed. The MEMS sensor structure 100 may include a lead frame 102 for supporting a MEMS sensor, a recess 104 in a surface of the lead frame 102, and a MEMS sensor 106 coupled to the surface of the lead frame 102 and arranged over the recess 104 to form a chamber 108. The MEMS sensor structure 100 may further include, in some embodiments, an integrated circuit 110. The integrated circuit 110 may be electrically coupled to the MEMS sensor 106 and configured to process a signal generated by the MEMS sensor 106. According to various embodiments, MEMS sensor structure 100 may further include an encapsulation layer 112 disposed over a surface of the lead frame 102. In at least one embodiment, the encapsulation layer 112 may at least partially envelop and/or enclose the MEMS sensor 106 and the integrated circuit 110. According to various embodiments, MEMS sensor structure 100 may further include an opening 114 in the encapsulation layer 112. The opening 114 may be arranged such that a portion of the MEMS sensor 106 is not covered by the encapsulation layer 112. According to various embodiments, MEMS sensor structure 100 may further include a spacer structure 116 arranged at an edge region of the opening 114. The spacer structure 116 may be configured to prevent the encapsulation layer 112 from being deposited in the opening 114.

In various embodiments, the MEMS sensor structure 100 may have a height, H1, in the range from about 0.3 mm to about 1.5 mm, e.g. in the range from about 0.3 mm to about 0.5 mm, e.g. in the range from about 0.5 mm to about 0.7 mm, e.g. in the range from about 0.7 mm to about 1 mm, e.g. in the range from about 1 mm to about 1.5 mm.

Figure 2:
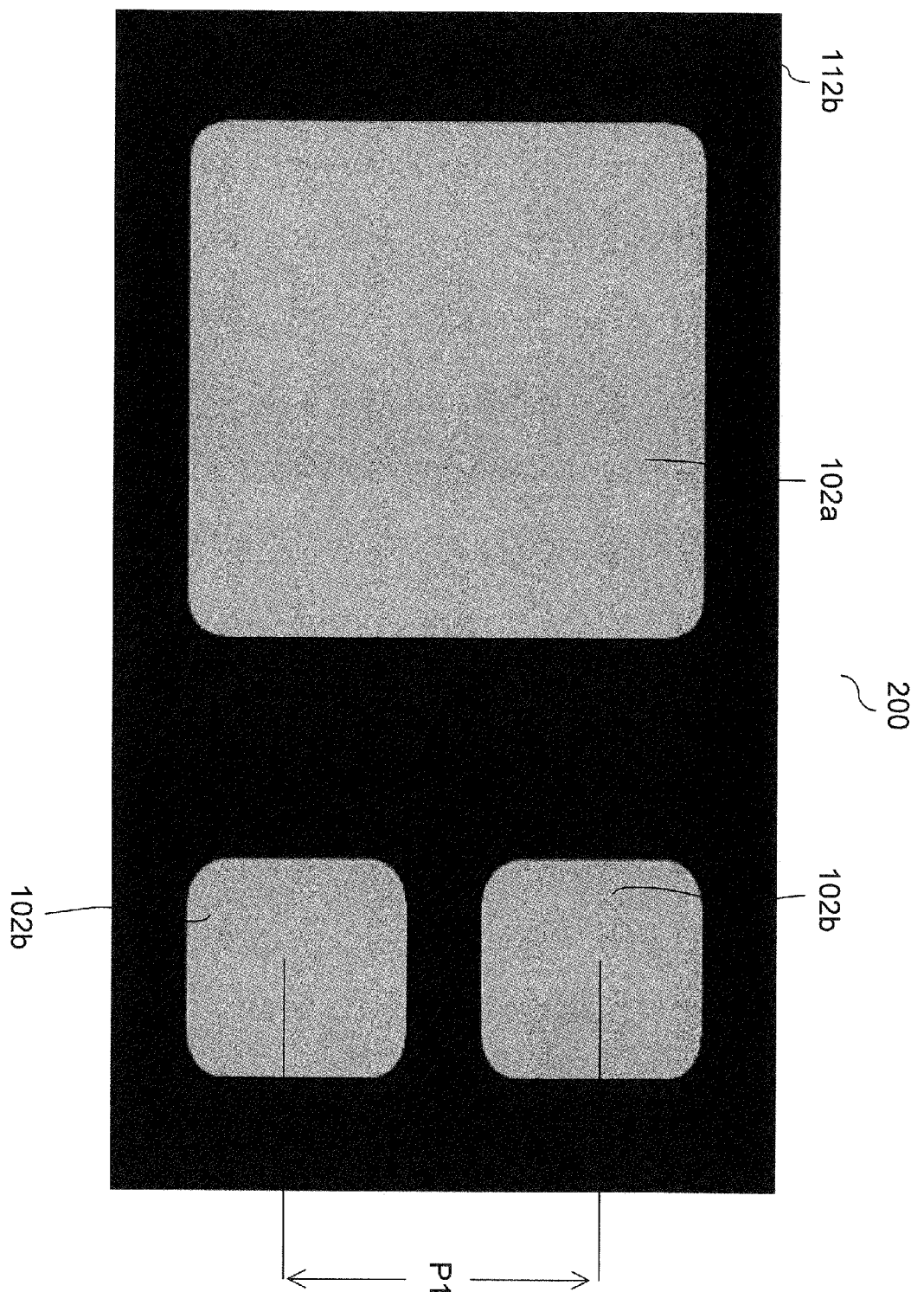
FIG. 2 depicts a bottom-up view of the transducer structure represented in FIG. 1.

In various embodiments, the lead frame 102 may include a semiconductor chip paddle region 102a and a plurality of electrical leads 102b arranged around the periphery of the semiconductor chip paddle region 102a. As illustrated in FIGS. 1 & 2, the semiconductor chip paddle region 102a may be square or substantially square in shape. In various embodiments, the semiconductor chip paddle region 102a may be rectangular or substantially rectangular in shape. The semiconductor chip paddle region 102a may be a circle or substantially circular in shape. The semiconductor chip paddle region 102a may be an oval or substantially oval-like in shape. According to various embodiments, the semiconductor chip paddle region 102a may be a triangle or substantially triangular in shape. The semiconductor chip paddle region 102a may be a cross or substantially cross shaped. According to various embodiments, the semiconductor chip paddle region 102a may be formed into any shape as may be desired for a given application. According to various embodiments, the semiconductor chip paddle region 102a may include or may be composed of various elemental metals, e.g. copper, nickel, tin, lead, silver, gold, aluminum, and various metal alloys such as e.g. cupronickel, nickel-aluminum, etc. The semiconductor chip paddle region 102a may include or be composed of various other materials, e.g. a metallic material, a metal foil, a solder wettable material, various metal alloys and/or compound metals, and various elemental metals as may be desirable for a given application. According to various embodiments, the semiconductor chip paddle region 102a may be implemented as type of heat-dissipating and/or heat sinking region of the lead frame 102. In various embodiments, the lead frame 102 may include a plurality of electrical leads 102b arranged around the periphery of the semiconductor chip paddle region 102a. In various embodiments, the plurality of electrical leads 102b may extend outward from the periphery of the semiconductor chip paddle region 102a in a radial fashion. According to various embodiments, the plurality of electrical leads 102b may include or may be composed of various metals, e.g. copper, nickel, tin, lead, silver, gold, aluminum, and various metal alloys such as e.g. cupronickel, nickel-aluminum, etc. The plurality of electrical leads 102b may include or be composed of various other materials, e.g. a metallic material, a metal foil, a solder wettable material, various metal alloys and/or compound metals, and various elemental metals as may be desirable for a given application. According to various embodiments, the lead frame 102 may be implemented as various molded lead frame chip packaging formats, e.g. a micro lead frame package (MLP), a small-outline no leads package (SON), a quad-flat no-leads package (QFN), a dual-flat no-leads package (DFN), various air-cavity and/or plastic-molded QFN packages, and other lead frame configurations as may be desirable for a given application.

In at least one embodiment, the recess 104 may be formed in a surface of the lead frame 102. As illustrated in FIG. 1, the recess 104 may be formed in the semiconductor chip paddle region 102a of the lead frame 102. In various other embodiments, the recess 104 may be formed in other parts of the lead frame 102. According to various embodiments, the recess 104 may formed in the lead frame 102 by various techniques, e.g. deep reactive-ion etching, isotropic gas phase etching, vapor etching, wet etching, isotropic dry etching, plasma etching, laser drilling, various grinding techniques, and other techniques as may be desirable for a given application. In various embodiments, the recess 104 may be square or substantially square in shape. The recess 104 may be rectangular or substantially rectangular in shape. According to various embodiments, the recess 104 may be a circle or substantially circular in shape. The recess 104 may be an oval or substantially oval-like in shape. According to various embodiments, the recess 104 may be a triangle or substantially triangular in shape. The recess 104 may be a cross or substantially cross shaped. According to various embodiments, the recess 104 may be formed into any shape that may be desired for a given application. In some embodiments, the recess 104 may be implemented as a hole which completely perforates a portion of the lead frame 102. In at least one embodiment, the recess 104 may have a depth D1 in the range from about 50 µm to about 1 mm, e.g. in the range from about 50 µm to about 100 µm, e.g. in the range from about 100 µm to about 200 µm, e.g. in the range from about 200 µm to about 300 µm, e.g. in the range from about 300 µm to about 500 µm, e.g. in the range from about 500 µm to about 1 mm.

According to various embodiments, the MEMS sensor 106 may be coupled to the surface of the lead frame 102. The MEMS sensor 106 may be coupled to the surface of the lead frame 102 by a sealing layer 118a. The sealing layer 118a may be or may include various adhesives, sealants, and epoxies as may be desirable for a given application, for example a conductive or nonconductive epoxy, or a silicone based glue. The sealing layer 118a may be electrically conductive or may be an electrical insulator as may be required for a given application. The sealing layer 118a may be or may include a polymer adhesive such as SU-8 or benzocyclobutene (BCB). According to various embodiments, the sealing layer 118a may be or may include various adhesive foils. The sealing layer 118a may have a thickness as may be desirable for a given application, for example, in the range from about 5 µm to about 50 µm, e.g. in the range from about 5 µm to about 20 µm, e.g. in the range from about 20 µm to about 50 µm.

In various embodiments, the MEMS sensor 106 may be implemented as a MEMS microphone, a MEMS speaker, or a MEMS pressure sensor. In embodiments where the MEMS sensor 106 may be implemented as a MEMS microphone, the MEMS microphone may have a back volume 120 of about 5 cubic millimeters, e.g. in the range from about 0.5 cubic millimeters to about 1 cubic millimeter, e.g. in the range from about 1 cubic millimeter to about 1.5 cubic millimeters, e.g. in the range from about 1.5 cubic millimeters to about 3 cubic millimeters, e.g. in the range from about 3 cubic millimeters to about 5 cubic millimeters. In various embodiments, the MEMS microphone back volume 120 may have a depth, D2, in the range from about 50 µm to about 1 mm e.g. in the range from about 50 µm to about 100 µm, in the range from about 100 µm to about 200 µm, e.g. in the range from about 200 µm to about 300 µm, e.g. in the range from about 300 µm to about 500 µm, e.g. in the range from about 500 µm to about 1 mm.

In various embodiments, the MEMS sensor 106 may be arranged over the recess 104 to form the chamber 108. The chamber 108 may be formed by the recess 104 and the MEMS microphone back volume 120. The sealing layer 118a may acoustically seal the interface between the recess 104 and the MEMS microphone back volume 120. According to various embodiments, the recess 104 may extend and/or enlarge the MEMS microphone back volume 120 without increasing the overall height, H1, of the MEMS sensor structure 100. Increasing the size of the back volume 120 may result in an increased signal-to-noise ratio for the MEMS microphone.

According to various embodiments, as illustrated in FIG. 1, the integrated circuit 110 may be arranged and/or mounted on a surface of at least one of the plurality of electrical leads 102b. In various embodiments, the integrated circuit 110 may be secured to the surface of an electrical lead 102b by the sealing layer 118b. The sealing layer 118b may be or may include various adhesives, sealants, and epoxies as may be desirable for a given application, for example a conductive or nonconductive epoxy, or a silicone based glue. The sealing layer 118b may be electrically conductive or may be an electrical insulator as may be required for a given application. The sealing layer 118b may be or may include a polymer adhesive such as SU-8 or benzocyclobutene (BCB). According to various embodiments, the sealing layer 118b may be or may include various adhesive foils. The sealing layer 118b may have a thickness as may be desirable for a given application, for example, in the range from about 5 µm to about 50 µm, e.g. in the range from about 5 µm to about 20 µm, e.g. in the range from about 20 µm to about 50 µm.

In various embodiments, the integrated circuit 110 may be electrically coupled and/or connected to at least one of the plurality of electrical leads 102b. The integrated circuit 110 may be electrically connected to any number of the plurality of electrical leads 102b via wire-bond element 122. In some embodiments, the integrated circuit may be electrically connected to any of the plurality of electrical leads via conductive pads (not shown) on a surface of the integrated circuit.

In various embodiments, the integrated circuit 110 may be implemented as an application specific integrated circuit (ASIC). The integrated circuit 110 may be implemented as various types of ASICs, e.g. a gate-array ASIC, a standard-cell ASIC, a full-custom ASIC, a structured design ASIC, a cell-library ASIC, and various intellectual property (IP) core ASICs.

According to various embodiments, the integrated circuit 110 may be electrically coupled and/or connected to the MEMS sensor 106. The integrated circuit 110 may be electrically connected to the MEMS sensor 106 via wire-bond element 124. In some embodiments, the integrated circuit 110 may be configured to process at least one electrical signal generated by the MEMS sensor 106. For example, where the MEMS sensor 106 may be implemented as a MEMS microphone, the integrated circuit 110 may be configured to measure a capacitive signal generated in the MEMS sensor 106, e.g. by a sound wave incident on the MEMS sensor 106, and to convert said signal into usable information regarding the magnitude of the sound wave. In other exemplary embodiments, the MEMS sensor 106 may be implemented as a MEMS pressure sensor and the integrated circuit 110 may be configured to measure and process an electrical signal generated by the MEMS pressure sensor regarding a change in ambient pressure. In another exemplary embodiment, MEMS sensor 106 may be implemented as a MEMS speaker and the integrated circuit 110 may be configured to process and transmit an electrical signal to the MEMS speaker, where said signal may cause the MEMS speaker to generate sound waves at various magnitudes and frequencies as may be desirable for a given application.

According to various embodiments, as illustrated in FIG. 1, the MEMS sensor structure 100 may include the encapsulation layer 112. The encapsulation layer 112 may substantially encapsulate and/or cover the lead frame 102, the MEMS sensor 106, the integrated circuit 110, and the wire bonding elements 122 and 124, respectively. The encapsulation layer 112 may be formed and/or deposited through various processes, e.g. transfer molding, compression molding, injection molding, plunger molding, a film-assisted molding, a glob top process, and various sintering processes such as hot compression molding and isostatic pressing. According to various embodiments, the encapsulation layer 112 may be composed of or may include a molding material such as various thermosetting polymers, thermosetting plastics, thermosetting resins, a polyester resin, a film, a polyamide, and various epoxies or epoxy resins. In some embodiments, the encapsulation layer 112 may be composed of or may include any material that may be desirable for a given application.

According to various embodiments, the MEMS sensor structure 100 may include the opening 114 formed in the encapsulation layer 112. The opening 114 may be arranged such that a portion of the MEMS sensor 106 is not covered by the encapsulation layer 112. In various exemplary embodiments, the opening 114 may be formed in the encapsulation layer 112 and configured to allow a portion of the MEMS sensor 106 to remain exposed and/or in communication with the environment surrounding the MEMS sensor structure 100. In an exemplary embodiment where the MEMS sensor structure 100 may be implemented as a MEMS microphone, the opening 114 may allow a sound wave to cause a diaphragm element of the microphone to deflect. In an exemplary embodiment where the MEMS sensor structure 100 may be implemented as a MEMS pressure sensor, the opening 114 may allow a change in the ambient pressure surrounding the MEMS sensor structure 100 to cause a deflection in a membrane element of the pressure sensor. In various embodiments, According to various embodiments, the opening 114 may formed in the encapsulation layer 112 through various techniques, e.g. laser drilling, various grinding techniques, deep reactive-ion etching, isotropic gas phase etching, vapor etching, wet etching, isotropic dry etching, plasma etching, etc. In various embodiments, the opening 114 may be square or substantially square in shape. The opening 114 may be rectangular or substantially rectangular in shape. According to various embodiments, the opening 114 may be a circle or substantially circular in shape. The opening 114 may be an oval or substantially oval-like in shape. According to various embodiments, the opening 114 may be a triangle or substantially triangular in shape. The opening 114 may be a cross or substantially cross shaped. According to various embodiments, the opening 114 may be formed into any shape that may be desired for a given application.

According to various embodiments, as illustrated in FIG. 1, the MEMS sensor structure 100 may include at least one spacer structure 116. The spacer structure 116 may be arranged at an edge region of the opening 114. According to various embodiment, the spacer structure 116 may be composed of or may include a semiconductor material such as silicon, germanium, silicon germanium, silicon carbide, gallium nitride, indium, indium gallium nitride, indium gallium arsenide, indium gallium zinc oxide, or other elemental and/or compound semiconductors (e.g. a III-V compound semiconductor such as e.g. gallium arsenide or indium phosphide, or a II-VI compound semiconductor or a ternary compound semiconductor or a quaternary compound semiconductor) as may be desired for a given application. In various embodiments, the spacer structure 116 may be composed of or may include various photopolymers, photo-resins, thermoplastics, and photoresists, e.g. various acrylates, methacrylates, photoinitiators, epoxide resins, negative photoresists, and positive photoresists. In various embodiments, spacer structure 116 may have a height, H2, in the range from about 5 µm to about 500 µm, e.g. in the range from about 5 µm to about 10 µm, e.g. in the range from about 10 µm to about 20 µm, e.g. in the range from about 20 µm to about 30 µm, e.g. in the range from about 30 µm to about 50 µm, e.g. in the range from about 50 µm to about 100 µm, e.g. in the range from about 100 µm to about 200 µm, e.g. in the range from about 200 µm to about 300 µm, e.g. in the range from about 300 µm to about 500 µm. According to various embodiments, the spacer structure 116 may be deposited through various techniques, e.g. vapor deposition, electrochemical deposition, chemical vapor deposition, molecular beam epitaxy, spin coating, and various other techniques as may be desirable for a given application. In various exemplary embodiments, the spacer structure 116 may be configured to prevent the encapsulation layer 112 from being deposited in the opening 114. The spacer structure 116 may be part of a frame or frame-like structure arranged at an edge region of the opening 114. In various embodiments, said frame or frame-like structure may be configured to assist in a transfer molding process, such as a film-assisted molding process.

According to various embodiments, as illustrated in FIG. 2, the plurality of electrical leads 102b may be arranged at or near the periphery of a surface 112b of the encapsulation material 112. The surface 112b may be a bottom surface of the encapsulation layer 112. In other words, the surface 112b may be a surface designed to be coupled to a substrate and/or a printed circuit board. In various embodiments, the semiconductor chip paddle region 102a may be substantially enclosed and/or surrounded by the plurality of electrical leads 102b. In other words, the chip paddle region 102a may be more centrally located than the plurality of electrical leads 102b on/in the surface 112b of the encapsulation material 112. In various embodiments, the encapsulation material 112, the chip paddle region 102a, and the plurality of electrical leads 102b may be implemented as various molded leadframe chip packaging formats, e.g. a micro lead frame package (MLP), a small-outline no leads package (SON), a quad-flat no-leads package (QFN), a dual-flat no-leads package (DFN), various air-cavity and/or plastic-molded QFN packages, and various other lead frame configurations as may be desirable for a given application.

According to various embodiments, the distance between the electrical leads 102b, denoted by reference figure P1 in FIG. 2, may be in the range from about 0.30 mm to about 1 mm, e.g. in the range from about 0.30 mm to about 0.35 mm, e.g. in the range from about 0.35 mm to about 0.40 mm, e.g. in the range from about 0.40 mm to about 0.45 mm, e.g. in the range from about 0.45 mm to about 0.50 mm, e.g. in the range from about 0.50 mm to about 0.55 mm, e.g. in the range from about 0.55 mm to about 0.60 mm, e.g. in the range from about 0.60 mm to about 0.65 mm, e.g. in the range from about 0.65 mm to about 0.70 mm, e.g. in the range from about 0.70 mm to about 0.75 mm, e.g. in the range from about 0.75 mm to about 0.80 mm, e.g. in the range from about 0.80 mm to about 0.85 mm, e.g. in the range from about 0.85 mm to about 0.90 mm, e.g. in the range from about 0.90 mm to about 1.0 mm.

Figure 3:
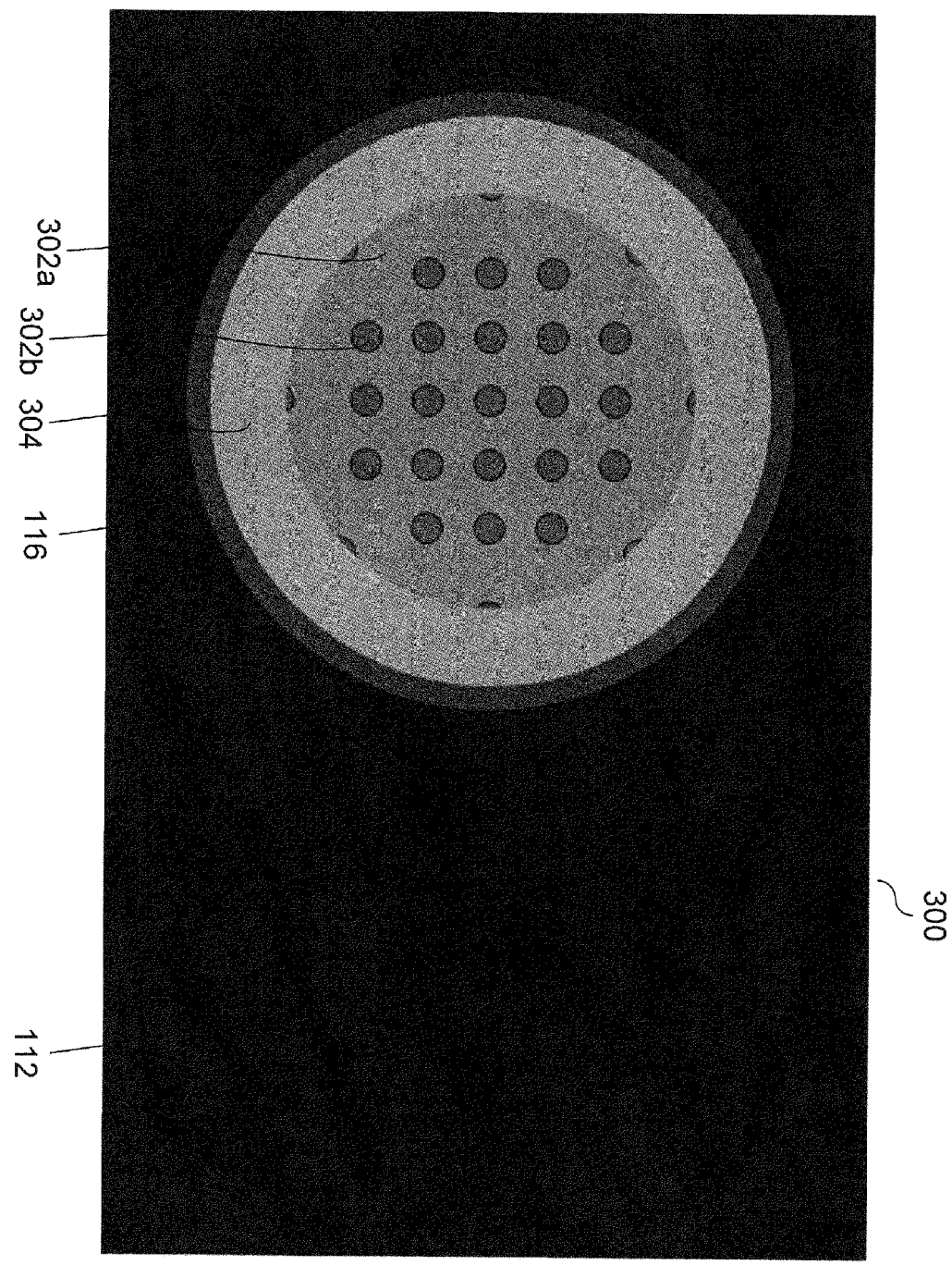
FIG. 3 depicts a top-down view of the transducer structure represented in FIG. 1.

According to various embodiments, as illustrated in FIG. 3, the MEMS sensor structure 100 may be implemented as a MEMS microphone structure 300 which may include at least one membrane structure 302a and a perforated electrode element 302b. The at least one membrane structure 302a and perforated electrode element 302b may be mounted and/or suspended across a semiconductor support structure 304. In various embodiments, the MEMS microphone structure 300 may also include the spacer structure 116, described at length above. In various embodiments, the spacer structure 116 may be configured to prevent the encapsulation layer 112 from being deposited onto the at least one membrane structure 302a and the perforated electrode element 302b. In various exemplary embodiments, the MEMS sensor structure 100 may be implemented as various other MEMS sensors and/or transducers that implement flexible membranes, e.g. MEMS pressure sensors, MEMS speakers, etc.

Figure 4:
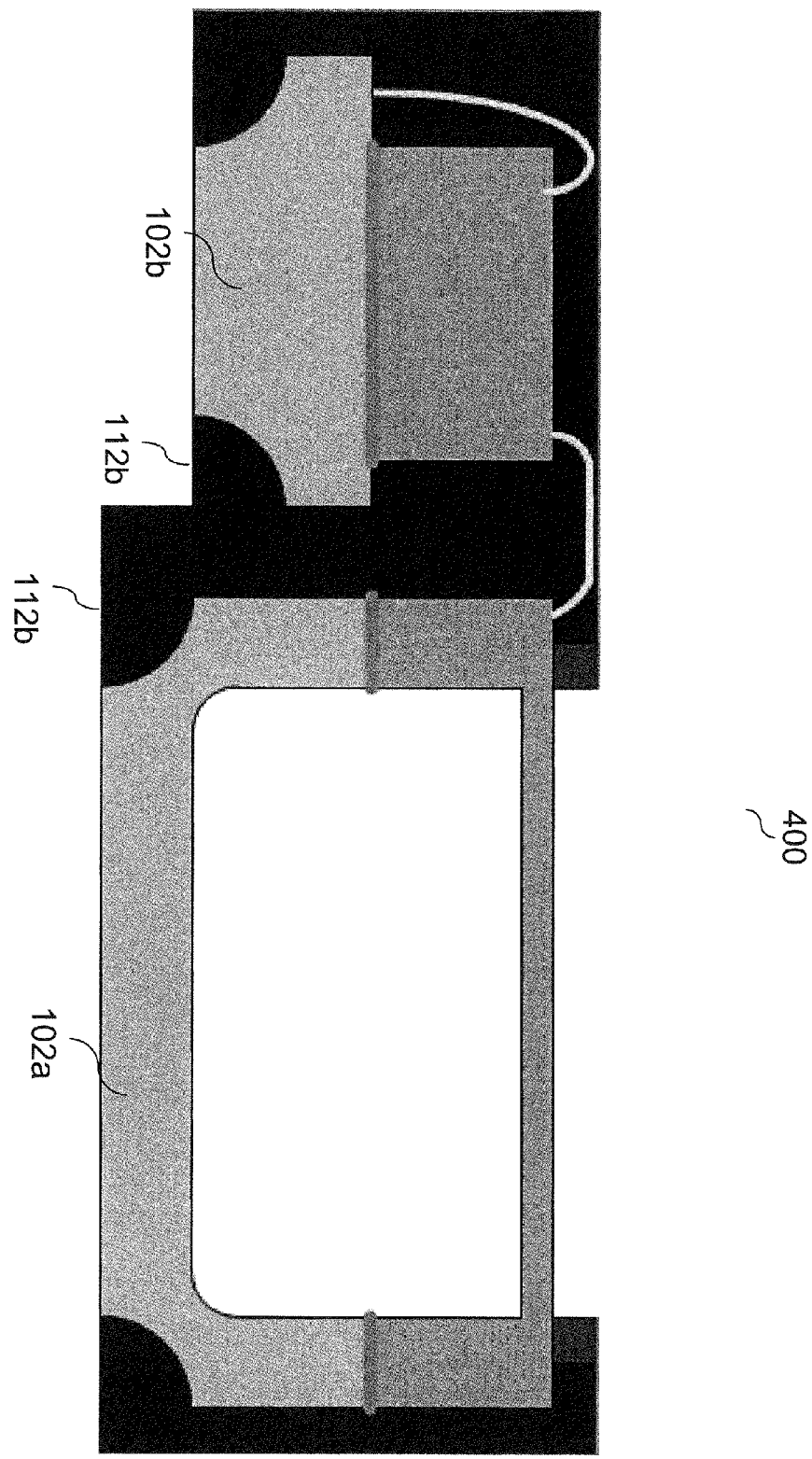
FIG. 4 depicts a cross-sectional representation of a lead frame based transducer structure arranged in a step-like configuration in accordance with various embodiments.

According to various embodiments, as illustrated in FIG. 4, the MEMS sensor structure 100 may be implemented as step-like MEMS sensor structure 400. In various embodiments, the step-like structure 400 may be arranged and/or configured so that the chip paddle region 102a and the plurality of electrical leads 102b are vertically displaced from one another. In other words, the surface 112b of the encapsulation layer 112 may be structured so that a tiered structure is formed, where the chip paddle region 102a may be located in a first tier and the plurality of electrical leads 102b may be located in a second tier.

Figure 5:
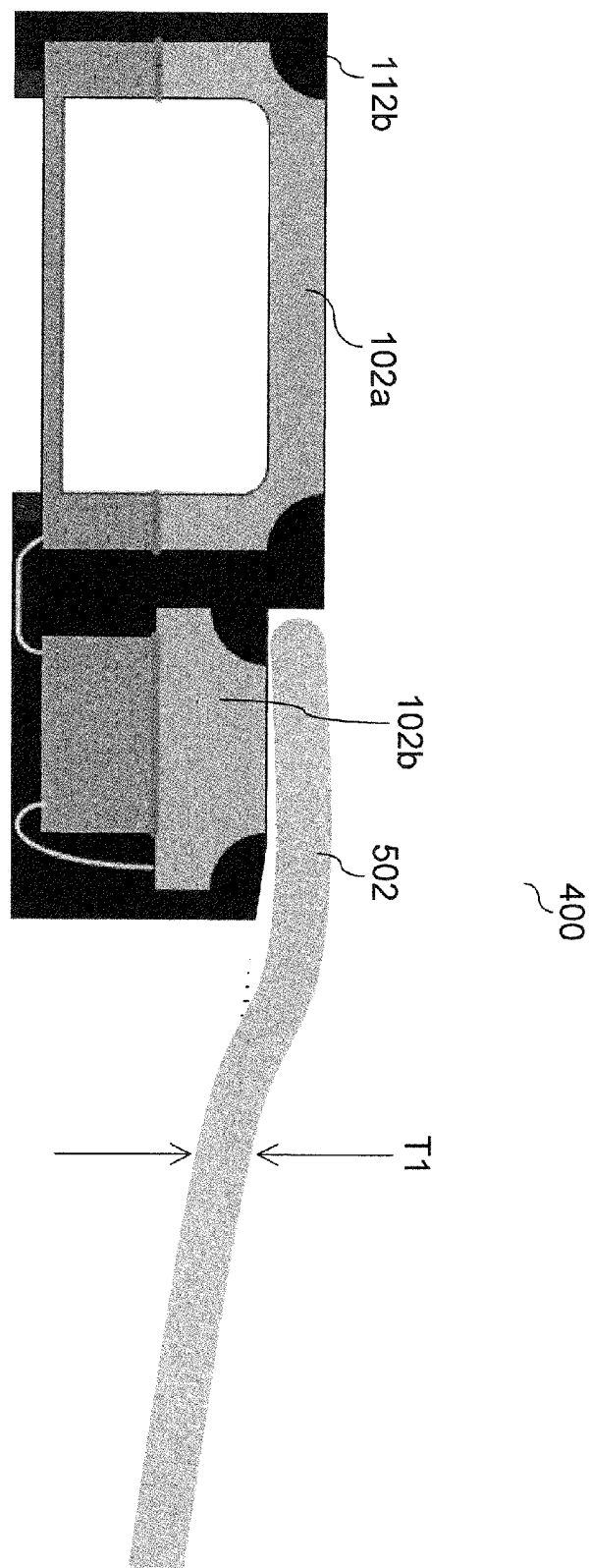
FIG. 5 depicts a cross-sectional representation of a potential embodiment of the transducer structure represented in FIG. 4.

According to various embodiments, as illustrated in FIG. 5, the step-like MEMS sensor structure 400 may be configured for coupling with a substrate 502. According to various embodiments, the substrate 502 may be electrically coupled to one or more of the plurality of electrical leads 102b. According to various embodiments, the substrate 502 may be a flexible substrate, such as a flexible plastic substrate, e.g. a polyimide substrate. In various embodiments, the substrate 502 may be composed of or may include one or more of the following materials: a polyester film, a thermoset plastic, a metal, a metalized plastic, a metal foil, and a polymer. In various embodiments, the substrate may be a flexible laminate structure. According to various embodiments, the substrate 502 may be a semiconductor substrate, such as a silicon substrate. The substrate 502 may include or essentially consist of other semiconductor materials such as germanium, silicon germanium, silicon carbide, gallium nitride, indium, indium gallium nitride, indium gallium arsenide, indium gallium zinc oxide, or other elemental and/or compound semiconductors (e.g. a III-V compound semiconductor such as e.g. gallium arsenide or indium phosphide, or a II-VI compound semiconductor or a ternary compound semiconductor or a quaternary compound semiconductor) as may be desired for a given application. The substrate 502 may include or essentially consist of other materials or combinations of material, for example various dielectrics, metals, and polymers as may be desirable for a given application. The substrate 502 may include or essentially consist of, for example, glass, and/or various polymers. The substrate 502 may be a silicon-on-insulator (SOI) structure. The substrate 502 may be a printed circuit board. In various exemplary embodiments, the substrate 502 may have a thickness T1 in the range from about 100 μm to about 700 μm, e.g. in the range from about 150 μm to about 650 μm, e.g. in the range from about 200 μm to about 600 μm, e.g. in the range from about 250 μm to about 550 μm, e.g. in the range from about 300 μm to about 500 μm, e.g. in the range from about 350 μm to about 450 μm. In some embodiments, the substrate 502 may have a thickness T1 of at least about 100 μm, e.g. of at least 150 μm, e.g. of at least 200 μm, e.g. of at least 250 μm, e.g. of at least 300 μm. In at least one embodiment, the substrate 502 may have a thickness T1 of less than or equal to about 700 μm, e.g. of less than or equal to 650 μm, e.g. of less than or equal to 600 μm, e.g. of less than or equal to 550 μm, e.g. of less than or equal to 500 μm.

Figure 6:
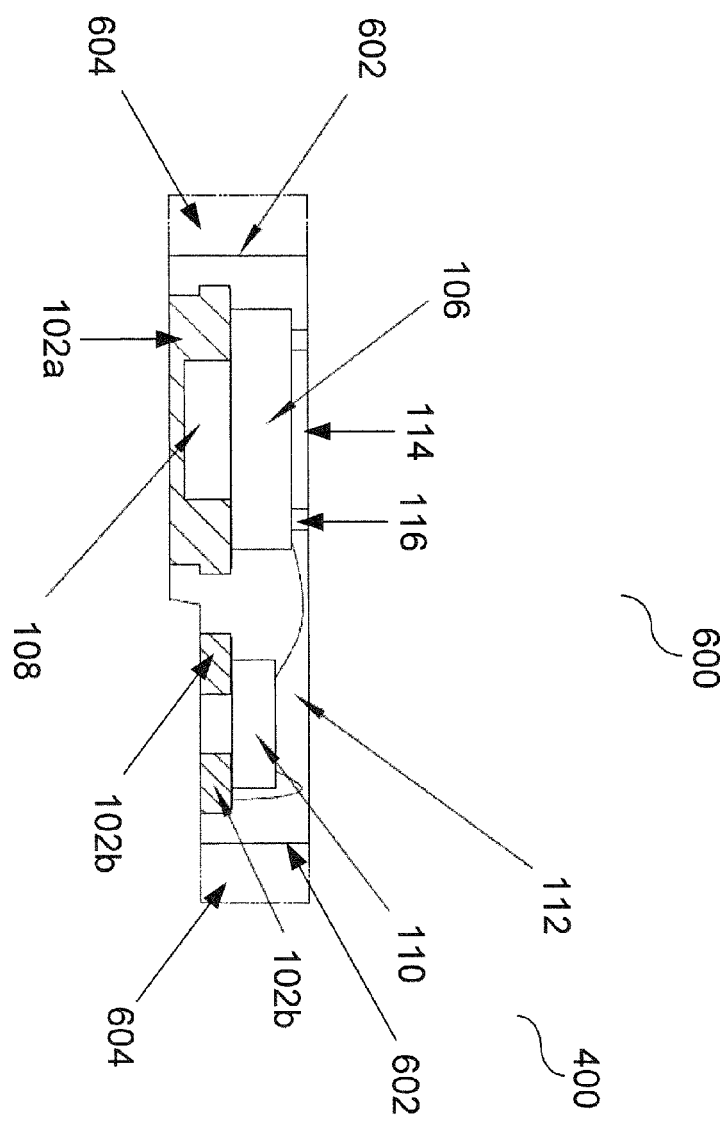
FIG. 6 depicts a potential embodiment, in schematic cross-sectional form, of the step-like lead frame based transducer structure represented in FIG. 4.

According to various embodiments, as depicted by the schematic representation 600 in FIG. 6, the MEMS sensor 106 may be coupled to the chip paddle region 102a of the lead frame 102. The MEMS sensor 106 may be coupled and/or mounted to the chip paddle region 102a through the various techniques as discussed in detail above. Likewise depicted in the schematic representation 600 is the integrated circuit 110 which may be coupled to and/or mounted on the plurality of electrical leads 102b. The schematic representation 600 further depicts, in accordance with various embodiments, the chamber 108, the encapsulation layer 112, the spacer structure 116, and the opening 114. According to various embodiments, the step-like MEMS sensor structure 400 may be manufactured by various semiconductor device fabrication techniques, some of which may employ various device singulation techniques, e.g. dicing. In the exemplary embodiment depicted in schematic representation 600, the final package outline of the step-like MEMS sensor structure 400 is denoted by reference FIG. 602. In the exemplary embodiment depicted in schematic representation 600, the portions of the step-like MEMS sensor structure 400 denoted by reference FIG. 604 may be removed during the singulation process. In various embodiments, the regions 604 may be the so-called scribe lines and/or saw streets used in various wafer fabrication techniques.

Figure 7:
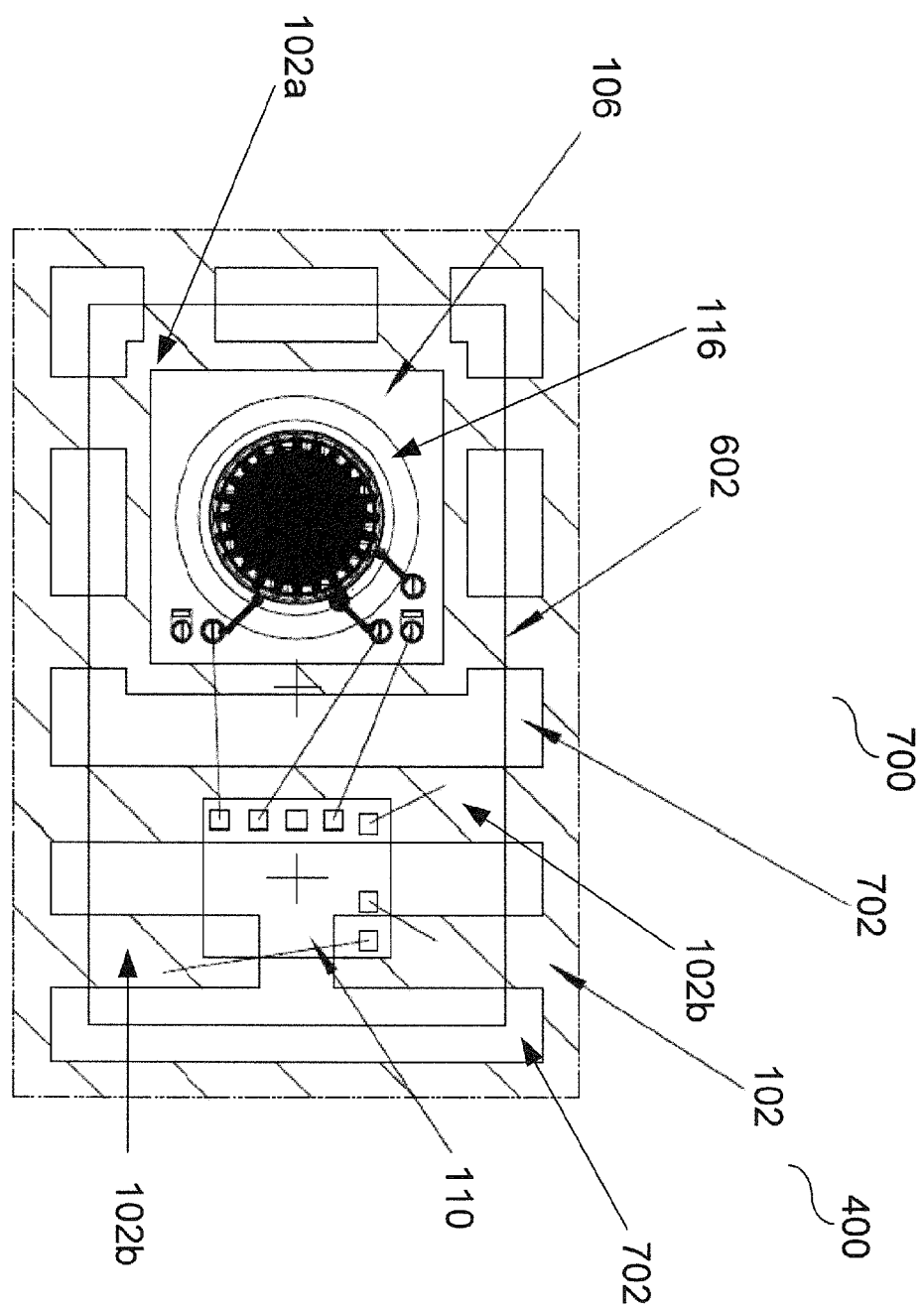
FIG. 7 depicts a top-down view, in schematic form, of the transducer structure represented in FIG. 4.

According to various embodiments, as depicted by the schematic representation 700 in FIG. 7, the lead frame 102 of the step-like MEMS sensor structure 400 may include several openings and/or openings 702. In various embodiments, the openings 702 may be implemented to structure and/or define the plurality of electrical leads 102b.

Figure 8:
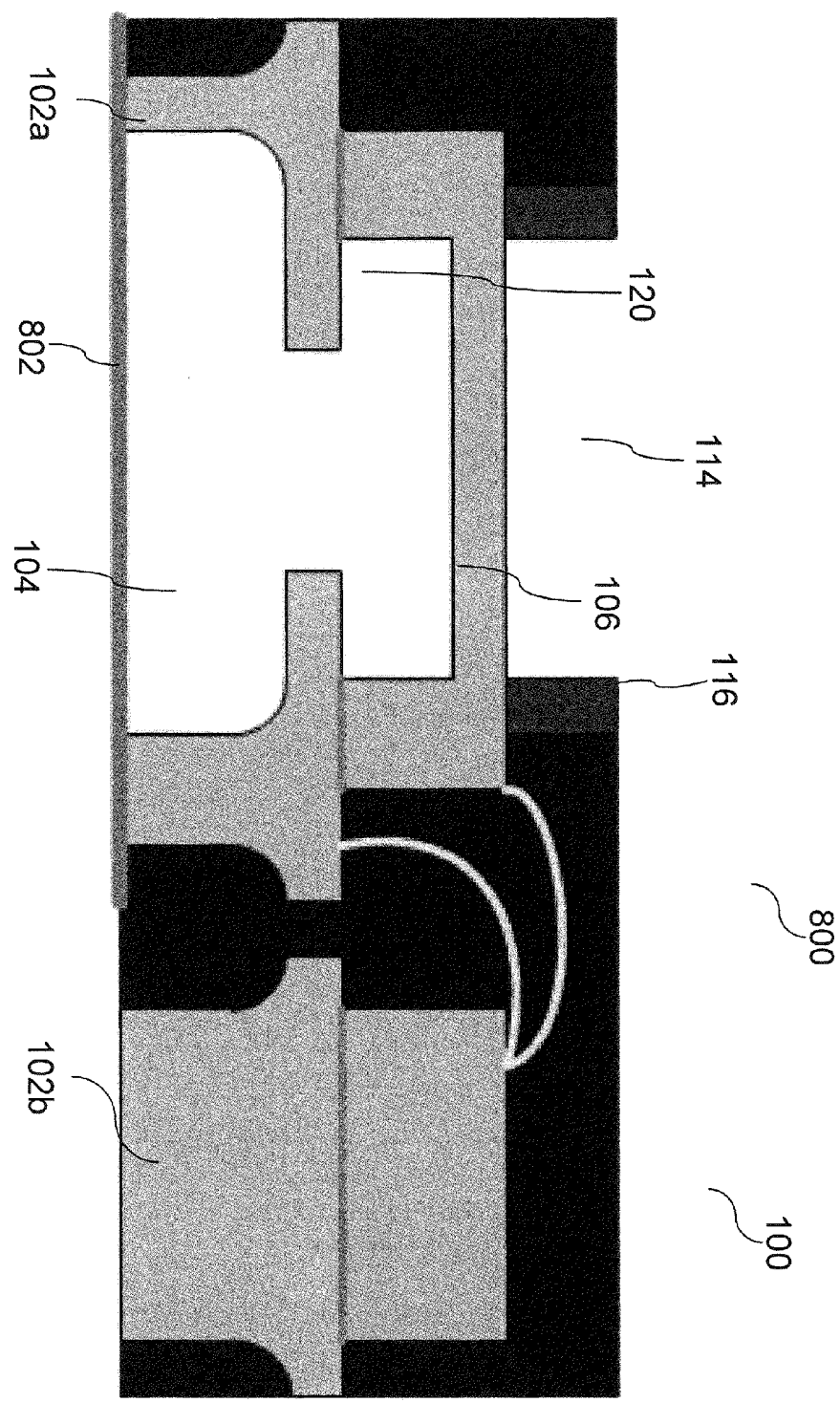
FIG. 8 depicts a cross-sectional representation of a lead frame based transducer structure in accordance with various embodiments.

According to various embodiments, as depicted by the schematic representation 800 in FIG. 8, the recess 104 may extend completely though the chip paddle region 102a of the lead frame 102 such that the recess perforates the chip paddle region 102a. In various embodiments, a portion of the recess 104 may extend laterally into the chip paddle region 102a. In some embodiments, a portion of the recess 104 may extend laterally into the chip paddle region 102a beyond the periphery of the MEMS sensor 106. In various embodiments, the portion of the recess 104 which extends laterally into the chip paddle region 102a may be implemented as an arch-like and/or vaulted structure. In various embodiments, the portion of the recess 104 which extends laterally into the chip paddle region 102a may be implemented as may be a cubic or cube-like structure. In various embodiments, the portion of the recess 104 which extends laterally into the chip paddle region 102a may be implemented as a spherical or sphere-like structure. In various embodiments, the portion of the recess 104 which extends laterally into the chip paddle region 102a may be implemented as a pyramidal or pyramid-like structure. According to various embodiments, the portion of the recess 104 which extends laterally into the chip paddle region 102a may be formed into any shape as may be desired for a given application.

In various exemplary embodiments where the recess 104 may be implemented as a perforation in the chip paddle region 102a, the sensor structure 100 may include a sealing structure 802 arranged across an opening of the recess 104. In various embodiments, the sealing structure 802 may be arranged to acoustically seal one end of the perforation formed in the chip paddle region 102a by the recess 104. The sealing structure 802 may be composed of or may include various adhesives, sealants, epoxies, polymers, plastics, resins, films, polyamides, metalized materials, elemental metals, metal foils, and metal alloys of various types. The sealing structure may be composed of or may include any material that may be desirable for a given application.

Figure 9:
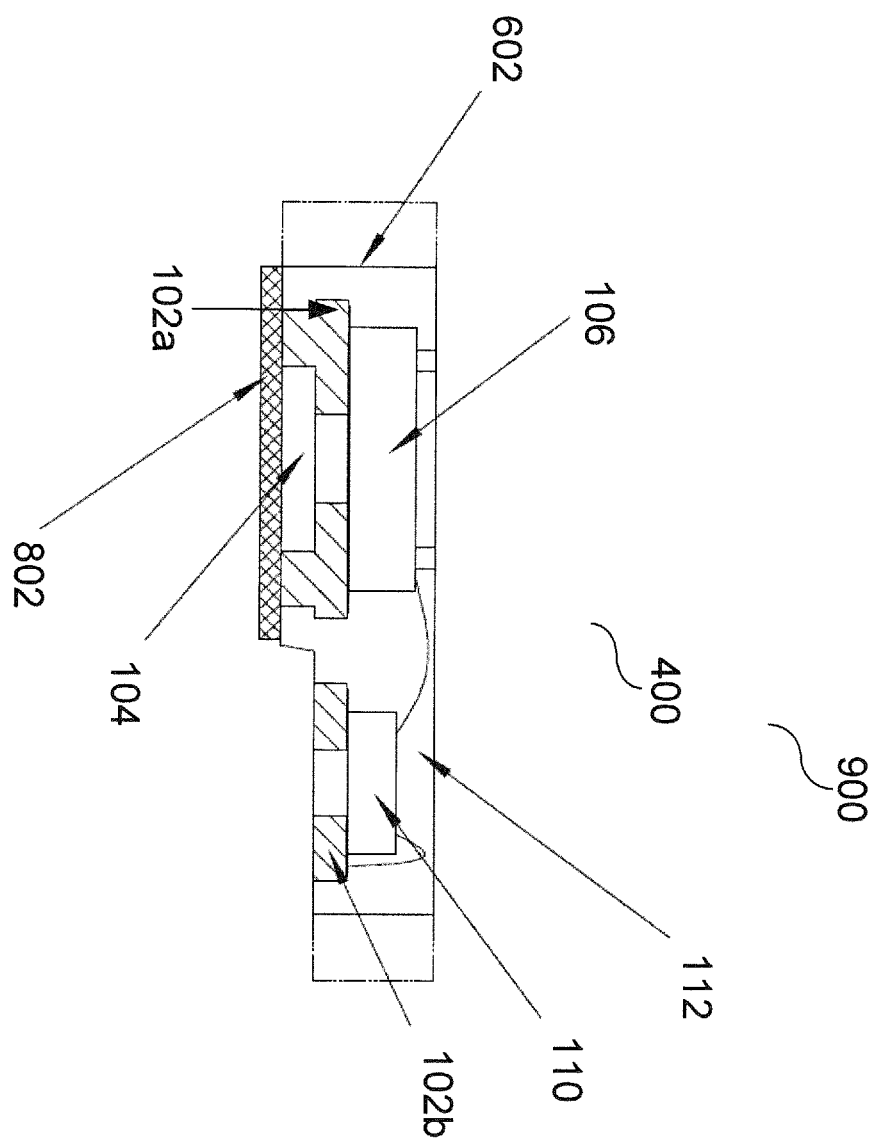
FIG. 9 depicts a potential embodiment, in schematic cross-sectional form, of the step-like lead frame based transducer structure represented in FIG. 8.

According to various embodiments, as depicted by the schematic representation 900 in FIG. 9, the MEMS sensor 106 may be coupled to the chip paddle region 102a of the lead frame 102. The MEMS sensor structure 106 may be coupled and/or mounted to the chip paddle region 102a through the various techniques discussed in detail above. Likewise depicted in the schematic representation 900 is the integrated circuit 110 which may be coupled to and/or mounted on the plurality of electrical leads 102b. The schematic representation 900 further depicts, in accordance with various embodiments, the encapsulation layer 112 and the spacer structure 116. Further illustrated in schematic representation 900, is an exemplary embodiment where the recess 104 is implemented as a perforation in the chip paddle region 102a. In the exemplary embodiment depicted in schematic representation 900, the recess 104 extends laterally into the chip paddle region 102a. According to various embodiments, the step-like MEMS sensor structure 400 may be manufactured by various semiconductor device fabrication techniques, some of which may employ various device singulation techniques, e.g. dicing. In the exemplary embodiment depicted in schematic representation 900, the final package outline of the step-like MEMS sensor structure 400 is denoted by reference FIG. 602. In various embodiments, as illustrated in schematic representation 900 and discussed above, the sealing structure 802 may be arranged to acoustically seal one end of the perforation formed in the chip paddle region 102a by the recess 104.

Figure 10:
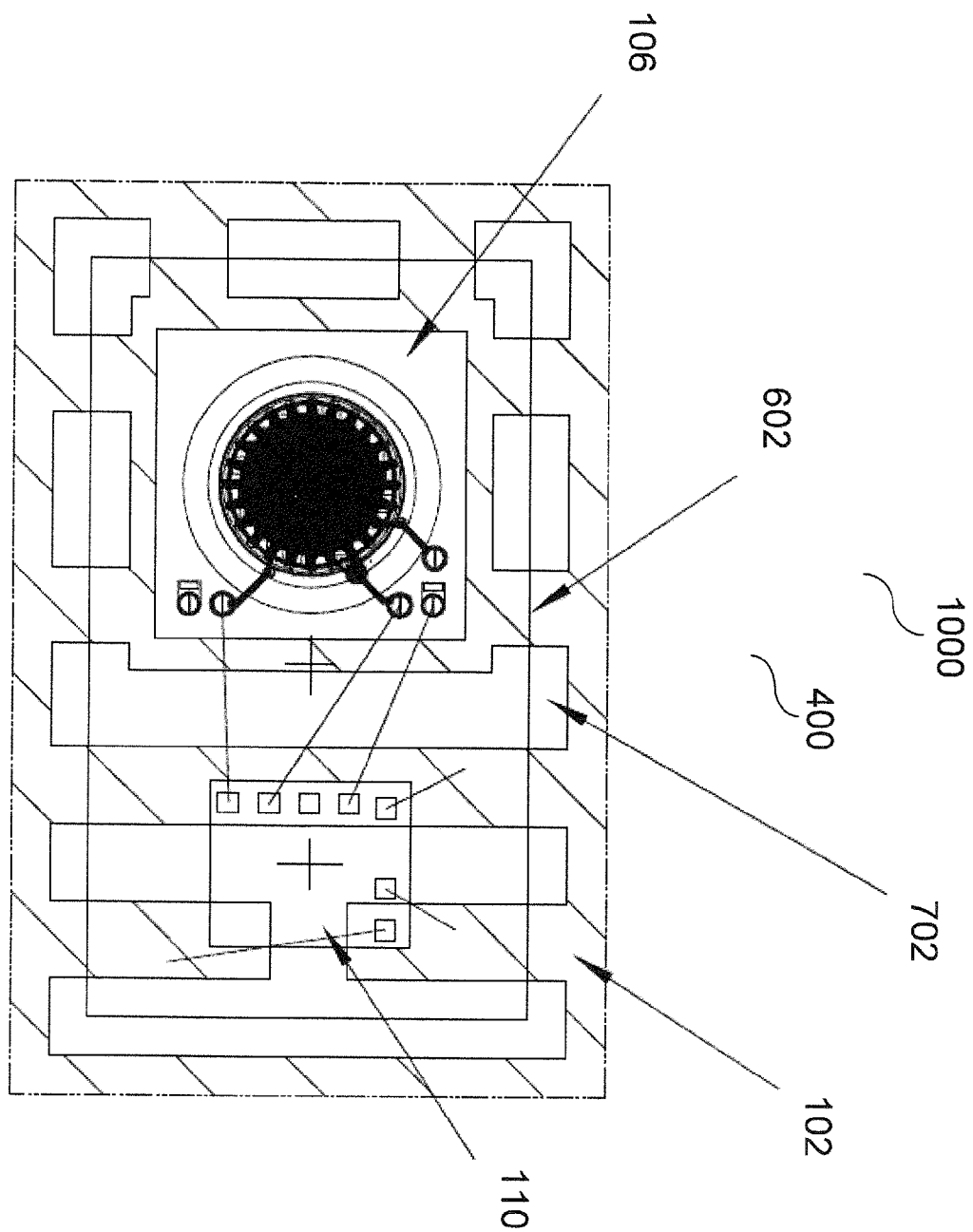
FIG. 10 depicts a top-down view, in schematic form, of the transducer structure represented in FIG. 8.

According to various embodiments, as depicted by the schematic representation 1000 in FIG. 10, the lead frame 102 of the step-like MEMS sensor structure 400 may include several openings and/or openings 702. In various embodiments, the openings 702 may be implemented to structure and/or define the plurality of electrical leads 102b.

The following examples pertain to further exemplary embodiments.

In Example 1, a sensor structure which may include: a lead frame for supporting a MEMS sensor; a recess in a surface of the lead frame; and a MEMS sensor coupled to the surface of the lead frame and arranged over the recess to form a chamber.

In Example 2, the sensor structure of Example 1, where the lead frame may be implemented as a semiconductor chip paddle region and a plurality of electrical leads configured to be connected to a circuit board and arranged around the periphery of the semiconductor chip paddle region.

In Example 3, the sensor structure of Example 2, where the recess may be formed in the chip paddle region.

In Example 4, the sensor structure of Example 1, where the MEMS sensor may include at least one diaphragm structure.

In Example 5, the sensor structure of Example 1, may also include: an integrated circuit electrically coupled to the MEMS sensor; where the integrated circuit may be configured to process a signal generated by the MEMS sensor.

In Example 6, the sensor structure of Example 5, where the integrated circuit may be electrically coupled to the MEMS sensor through a wire bonding process.

In Example 7, the sensor structure of Example 5, where the integrated circuit may be electrically coupled to the lead frame.

In Example 8, the sensor structure of Example 5 may further include: an encapsulation layer which may be disposed over a surface of the lead frame; where the encapsulation layer may at least partially envelop the MEMS sensor and the integrated circuit.

In Example 9, the sensor structure of Example 8 may further include: an opening in the encapsulation layer; wherein the opening may be arranged such that a portion of the MEMS sensor is not covered by the encapsulation layer.

In Example 10, the sensor structure of Example 8, where the encapsulation layer may be deposited through a transfer molding process.

In Example 11, the sensor structure of Example 9 may further include: a spacer structure arranged at an edge region of the opening; where the spacer structure may be configured to prevent the encapsulation layer from being deposited in the opening.

In Example 12, a sensor structure, which may include: a lead frame for supporting a MEMS sensor; a through hole formed in a portion of the lead frame; and a MEMS sensor coupled to a surface of the lead frame and arranged over an opening of the through hole to form a vaulted structure.

In Example 13, the sensor structure of Example 12, may further include: a structure configured to seal an opening of the through hole; where the structure may be arranged at an opposite end of the through hole from the MEMS sensor.

In Example 14, the sensor structure of Example 13, where the lead frame may be implemented as a semiconductor chip paddle region and a plurality of electrical leads configured to be connected to a circuit board and arranged around the periphery of the semiconductor chip paddle region.

In Example 15, the sensor structure of Example 14, where the through hole may be formed in the semiconductor chip paddle region.

In Example 16, the sensor structure of Example 13, where the MEMS sensor may be implemented as at least one diaphragm structure.

In Example 17, the sensor structure of Example 13 may further include: an integrated circuit electrically coupled to the MEMS sensor; where the integrated circuit may be configured to process a signal generated by the MEMS sensor.

In Example 18, the sensor structure of Example 13 may further include: an encapsulation layer disposed over a surface of the lead frame; where the encapsulation layer may at least partially envelop the MEMS sensor and the integrated circuit.

In Example 19, the sensor structure of Example 18 may further include: an opening in the encapsulation layer; where the opening may be arranged such that a portion of the MEMS sensor is not covered by the encapsulation layer.

In Example 20, the sensor structure of Example 18 may further include: a spacer structure arranged at an edge region of the opening; where the spacer structure may be configured to prevent the encapsulation layer from being deposited in the opening.

In Example 21, the sensor structure of Example 18, where a portion of the through hole may extend laterally into the lead frame beyond the perimeter of the MEMS sensor.

In Example 22, a sensor structure, which may include: a lead frame for supporting a MEMS sensor; a recess in a surface of the lead frame; and a MEMS sensor arranged over the recess to form a chamber.

In Example 23, the sensor structure of Example 22, where the lead frame may be implemented as a semiconductor chip paddle region and a plurality of electrical leads configured to be connected to a circuit board and arranged around the periphery of the semiconductor chip paddle region.

In Example 24, the sensor structure of Example 22, where the MEMS sensor may be implemented as at least one diaphragm structure.

In Example 25, the sensor structure of Example 22 may further include: an integrated circuit electrically coupled to the MEMS sensor; where the integrated circuit may be configured to process a signal generated by the MEMS sensor.

In Example 26, the sensor structure of Example 22 may further include: an encapsulation layer disposed over a surface of the lead frame; wherein the encapsulation layer may at least partially envelop the MEMS sensor and the integrated circuit.

In Example 27, the sensor structure of Example 26, where the encapsulation layer may fix the MEMS sensor and the integrated circuit to the lead frame.

In Example 28, the sensor structure of Example 26, where the encapsulation layer may be configured to seal the chamber formed by the MEMS sensor and the recess.

In Example 29, a sensor structure which may include: a lead frame for supporting a MEMS sensor; a through hole formed in a portion of the lead frame; and a MEMS sensor arranged over an opening of the through hole to form a vaulted structure.

In Example 30, the sensor structure of Example 29, where the lead frame may be implemented as a semiconductor chip paddle region and a plurality of electrical leads configured to be connected to a circuit board and arranged around the periphery of the semiconductor chip paddle region.

In Example 31, the sensor structure of Example 30, where the through hole may be formed in the semiconductor chip paddle region.

In Example 32, the sensor structure of Example 30 may further include: an encapsulation layer disposed over a surface of the lead frame; where the encapsulation layer may at least partially envelop the MEMS sensor and the integrated circuit.

In Example 33, the sensor structure of Example 32, where a portion of the through hole may extend laterally into the encapsulation layer beyond the perimeter of the MEMS sensor.

In Example 34, the sensor structure of Example 30, where the MEMS sensor may be implemented as at least one diaphragm structure.

In Example 35, the sensor structure of Example 32 may further include: a sealing structure configured to seal an opening of the through hole; where the sealing structure may be arranged at an opposite end of the through hole from the MEMS sensor.

In Example 36, the sensor structure of Example 35, where the sealing structure may be implemented as a metal foil.

In Example 37, the sensor structure of Example 36, where the metal foil may be less malleable than the at least one diaphragm structure.

In Example 38, the sensor structure of Example 36, where the metal foil may be less flexible than the at least one diaphragm structure.

In Example 39, the sensor structure of Example 36, where the metal foil may be substantially more rigid than the at least one diaphragm structure.

In Example 40, a method of forming a sensor structure, the method may include: providing a lead frame for supporting a MEMS sensor; forming a recess in a surface of the lead frame; and coupling a MEMS sensor to the surface of the lead frame and arranging the MEMS sensor over the recess to form a chamber.

In Example 41, the method of Example 40, where the lead frame may be implemented as a semiconductor chip paddle region and a plurality of electrical leads configured to be connected to a circuit board and arranged around the periphery of the semiconductor chip paddle region.

In Example 42, the method of Example 41, where the recess may be formed in the semiconductor chip paddle region.

In Example 43, the method of Example 40 where the method may further include: providing an integrated circuit and electrically coupling the integrated circuit to the MEMS sensor and configuring the integrated circuit is to process a signal generated by the MEMS sensor.

In Example 44, the method of Example 43, where the integrated circuit may be electrically coupled to the MEMS sensor through a wire bonding process.

In Example 45, the method of Example 43, where the integrated circuit may be electrically coupled to the lead frame.

In Example 46, the method of Example 43 may further include: depositing an encapsulation layer over a surface of the lead frame; where the encapsulation layer may at least partially envelop the MEMS sensor and the integrated circuit.

In Example 47, the method of Example 46 may further include: forming an opening in the encapsulation material; and arranging the opening such that a portion of the MEMS sensor is not covered by the encapsulation layer.

In Example 48, the method of Example 46, where the encapsulation layer may be deposited through a transfer molding process.

In Example 49, the method of Example 47 may further include: providing a spacer structure arranged at an edge region of the opening; and configuring the spacer structure to prevent the encapsulation material from being deposited in the opening.

In Example 50, a method of forming a sensor structure, the method may include: providing a lead frame for supporting a MEMS sensor; forming a through hole in a portion of the lead frame; and coupling a MEMS sensor to a surface of the lead frame and arranging the MEMS sensor over an opening of the through hole to form a vaulted structure.

In Example 51, the method of Example 50, may further include: configuring a structure to seal an opening of the through hole; and arranging the structure at an opposite end of the through hole from the MEMS sensor.

In Example 52, the method of Example 50, where the lead frame may be implemented as a semiconductor chip paddle region and a plurality of electrical leads configured to be connected to a circuit board and arranged around the periphery of the semiconductor chip paddle region.

In Example 53, the method of Example 52, where the through hole may be formed in the semiconductor chip paddle region.

In Example 54, the method of Example 50, where the MEMS sensor may be implemented as at least one diaphragm structure.

In Example 55, the method of Example 50 may further include: an integrated circuit electrically coupled to the MEMS sensor; where the integrated circuit may be configured to process a signal generated by the MEMS sensor.

In Example 56, the method of Example 50 may further include: depositing an encapsulation layer over a surface of the lead frame; where the encapsulation layer may at least partially envelop the MEMS sensor and the integrated circuit.

In Example 57, the method of Example 56 may further include: forming an opening in the encapsulation material; and arranging the opening such that a portion of the MEMS sensor may not be covered by the encapsulation layer.

In Example 58, the method of Example 56 may further include: arranging a spacer structure at an edge region of the opening; and configuring the spacer structure is to prevent the encapsulation material from being deposited in the opening.

In Example 59, the method of Example 56, where a portion of the through hole may extend laterally into the encapsulation layer beyond the perimeter of the MEMS sensor.

In Example 60, the method of Example 59, where the portion of the through hole which extends laterally into the encapsulation layer beyond the perimeter of the MEMS sensor may be formed through an etching process.

In Example 61, the method of Example 59, where the portion of the through hole which may extend laterally into the encapsulation layer beyond the perimeter of the MEMS sensor may be implemented as a plurality of interconnected sphere-like structures.

In Example 62, the method of Example 61, where the interconnected sphere-like structures may be formed using a gas injection molding process.

While the disclosure has been particularly shown and described with reference to specific embodiments, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. A sensor structure, comprising:
a lead frame for supporting a MEMS sensor;
a recess in a surface of the lead frame; and
a MEMS sensor coupled to the surface of the lead frame and arranged over the recess to form a chamber.

2. The sensor structure of claim 1,
wherein the MEMS sensor comprises at least one diaphragm structure.

3. The sensor structure of claim 1,
the lead frame comprising a semiconductor chip paddle region and a plurality of electrical leads arranged around the periphery of the semiconductor chip paddle region; wherein at least one member of a group comprising the chip paddle region and the plurality of electrical leads are configured to be electrically connected to a circuit board.

4. The sensor structure of claim 3,
wherein the recess is formed in the chip paddle region.

5. The sensor structure of claim 1, further comprising:
an integrated circuit electrically coupled to the MEMS sensor;
wherein the integrated circuit is configured to process a signal generated by the MEMS sensor.

6. The sensor structure of claim 5,
wherein the integrated circuit is electrically coupled to the MEMS sensor through a
wire bonding process.

7. The sensor structure of claim 5,
wherein the integrated circuit is electrically coupled to the lead frame.

8. The sensor structure of claim 5, further comprising:
an encapsulation layer disposed over a surface of the lead frame;
wherein the encapsulation layer at least partially envelops the MEMS sensor and the
integrated circuit.

9. The sensor structure of claim 8,
wherein the encapsulation layer is deposited through a transfer molding process.

10. The sensor structure of claim 8, further comprising:
an opening in the encapsulation layer;
wherein the opening is arranged such that a portion of the MEMS sensor is not covered by the encapsulation layer.

11. The sensor structure of claim 10, further comprising:
a spacer structure arranged at an edge region of the opening;
wherein the spacer structure is configured to prevent the encapsulation layer from being deposited in the opening.

12. A sensor structure, comprising:
a lead frame for supporting a MEMS sensor;
a through hole formed in a portion of the lead frame; and
a MEMS sensor coupled to a surface of the lead frame and arranged over an opening of the through hole to form a vaulted structure.

13. The sensor structure of claim 12, further comprising:
a structure configured to seal an opening of the through hole;
wherein the structure is arranged at an opposite end of the through hole from the MEMS sensor.

14. The sensor structure of claim 13,
wherein the MEMS sensor comprises at least one diaphragm structure.

15. The sensor structure of claim 13, further comprising:
an integrated circuit electrically coupled to the MEMS sensor;
wherein the integrated circuit is configured to process a signal generated by the MEMS sensor.

16. The sensor structure of claim 13,
wherein the lead frame comprises a semiconductor chip paddle region and a plurality
of electrical leads configured to be connected to a circuit board and arranged around
the periphery of the semiconductor chip paddle region.

17. The sensor structure of claim 16,
wherein the through hole is formed in the semiconductor chip paddle region.

18. The sensor structure of claim 13, further comprising:
an encapsulation layer disposed over a surface of the lead frame;
wherein the encapsulation layer at least partially envelops the MEMS sensor and the
integrated circuit.

19. The sensor structure of claim 18, further comprising:
an opening in the encapsulation layer;
wherein the opening is arranged such that a portion of the MEMS sensor is not covered by the encapsulation layer.

20. The sensor structure of claim 18, further comprising:
a spacer structure arranged at an edge region of the opening;
wherein the spacer structure is configured to prevent the encapsulation layer from being deposited in the opening.

21. The sensor structure of claim 18,
wherein a portion of the through hole extends laterally into the lead frame beyond the perimeter of the MEMS sensor.

* * * * *